United States Patent
Baccini

(10) Patent No.: US 8,061,500 B2
(45) Date of Patent: Nov. 22, 2011

(54) ALIGNMENT DEVICE AND METHOD TO ALIGN PLATES FOR ELECTRONIC CIRCUITS

(75) Inventor: Andrea Baccini, San Biagio di Callalta (IT)

(73) Assignee: Applied Materials Italia S.R.L., Treviso (IT)

( * ) Notice: Subject to any disclaimer, the term of this patent is extended or adjusted under 35 U.S.C. 154(b) by 389 days.

(21) Appl. No.: 12/256,719

(22) Filed: Oct. 23, 2008

(65) Prior Publication Data
US 2009/0202323 A1    Aug. 13, 2009

(30) Foreign Application Priority Data
Oct. 24, 2007   (IT) .............................. UD2007A0197

(51) Int. Cl.
*B65G 29/00* (2006.01)
(52) U.S. Cl. ............... 198/345.1; 198/346.2; 198/345.3; 198/414; 198/463.2; 198/861.6
(58) Field of Classification Search ......................... None
See application file for complete search history.

(56) References Cited

U.S. PATENT DOCUMENTS

| | | | |
|---|---|---|---|
| 4,217,977 A | | 8/1980 | Tam |
| 4,457,419 A | | 7/1984 | Ogami et al. |
| 5,090,554 A | * | 2/1992 | De Sanctis ..................... 198/414 |
| 6,114,705 A | | 9/2000 | Leavitt et al. |
| 6,162,008 A | * | 12/2000 | Perkins et al. ................ 414/754 |
| 6,662,926 B1 | * | 12/2003 | Wood et al. ................ 198/370.1 |
| 2002/0000359 A1 | * | 1/2002 | Asai et al. ................... 198/346.2 |

FOREIGN PATENT DOCUMENTS

| | | |
|---|---|---|
| DE | 41 14 284 | 11/1992 |
| DE | 10 2005 062 936 | 7/2007 |
| JP | 5-166702 | 7/1993 |

* cited by examiner

*Primary Examiner* — Kavel Singh
(74) *Attorney, Agent, or Firm* — Patterson & Sheridan, L.L.P.

(57) ABSTRACT

An alignment device to align a plate for electronic circuits comprises transport members able to transport the plate along a transport axis, at least from an entrance position to an alignment position defining an alignment plane. The device also comprises mobile members provided with: first movement members able to move the mobile members in a first direction directed along a first axis substantially perpendicular to the alignment plane so as to associate the mobile members with the plate; second movement members able to rotate the plate, associated with the mobile members, around the first axis; and at least third movement members able to move the plate, associated with the mobile members, in a second direction, directed along a second axis substantially transverse to the first axis and substantially co-planar with the transport axis.

14 Claims, 3 Drawing Sheets

ALIGNMENT DEVICE AND METHOD TO ALIGN PLATES FOR ELECTRONIC CIRCUITS

FIELD OF THE INVENTION

The present invention concerns an alignment device and a method to align plates for electronic circuits with a defined geometric form. A typical application is that of wafers, for example silicon based or alumina based, in particular for photovoltaic cells or for green-tape type circuits. In particular, the device is able to be inserted in a plant for working said plates, also for example for the production of photovoltaic cells, in order to align the plates that are incorrectly positioned on the transport means, such as a conveyor belt, which transports the plates between the various work units of the plant.

BACKGROUND OF THE INVENTION

Plants for working plates for electronic circuits, for example silicon based or alumina based wafers, in particular for photovoltaic cells or for green-tape type circuits, are known, which comprise at least an alignment device to align the plates that upon exiting the work unit of the plant are incorrectly positioned on the conveyor belt able to move the plates between the various work units of the plant. Here and hereafter, by alignment we mean the positioning of the plate in a symmetrical position with respect to a median axis of the conveyor belt, directed along its direction of feed, so that a median axis of the plate coincides with the median axis of the conveyor belt.

Such known devices comprise gripping members, disposed perpendicularly to the plane of feed determined by the conveyor belt, and parallel to the direction of feed of the latter, able to correct the possible incorrect positioning of the plate, in order to align it so that it may be sent to the next work unit of the plant correctly.

One disadvantage of these known devices is that the gripping members can damage the plate to be aligned, in particular along its edge, which leads to the production of defective pieces. Furthermore, the gripping members can completely break the plate and this causes a complete stoppage of the production cycle in order to remove the broken piece, with the consequent economic problems that derive therefrom.

A further disadvantage of known devices is that the gripping members must be calibrated, or replaced, according to the sizes of the plate to be worked. Therefore, between two working phases of different sized plates, elaborate methods of calibration, or replacement, of the gripping members are required, which considerably delays the production cycle and causes substantial economic losses.

Purpose of the present invention is to achieve an alignment device to align a plate, which does not damage or accidentally break the plate, and which also aligns plates of all sizes without having to be replaced or undergo calibration steps.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purpose, an alignment device to align a plate for electronic circuits comprises transport means, such as a conveyor belt, able to transport the plate along a transport axis at least from a loading position to an alignment position, defining an alignment plane.

According to a characteristic feature of the present invention, the device also comprises mobile means, provided with first movement means able to move the mobile means in a first direction directed along a first axis, substantially perpendicular to said alignment plane, so as to associate the mobile means with the plate present in the alignment position.

The mobile means is also provided with second movement means able to rotate the plate, associated with said mobile means, around said first axis, and with at least third movement means able to move the plate, associated with said mobile means, in a second direction, directed along a second axis, substantially transverse to said first axis and substantially co-planar to the transport axis.

According to an advantageous feature of the present invention the mobile means is disposed under said alignment plane.

In this way, the placement of the mobile means under the alignment plane and the association of said means with the plate, allows to move the plate, for alignment, without damaging it. Furthermore, the mobile means is associated with plates of all shapes and this allows to avoid operations of calibration or substitution of the mobile means.

Advantageously, the alignment device also comprises image-acquisition means, such as a TV camera, disposed in correspondence with the alignment position so as to detect the position of the plate thereon.

Advantageously, the alignment position comprises lighting means so as to determine a retro-illumination effect in order to facilitate acquisition operations for the image-acquisition means.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT

Figure 1:
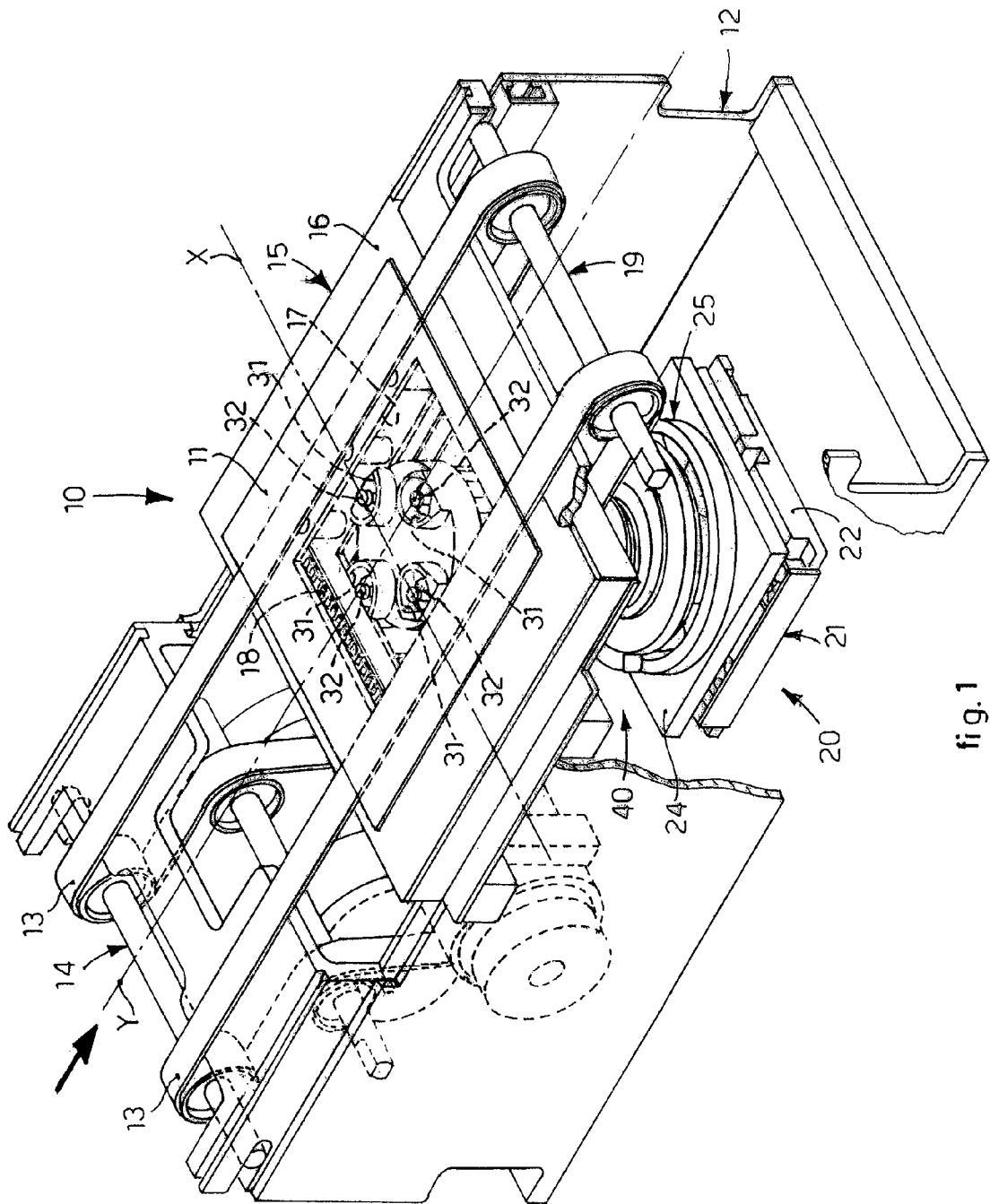
FIG. 1 is a three-dimensional view of an alignment device according to the present invention.
Figure 3:
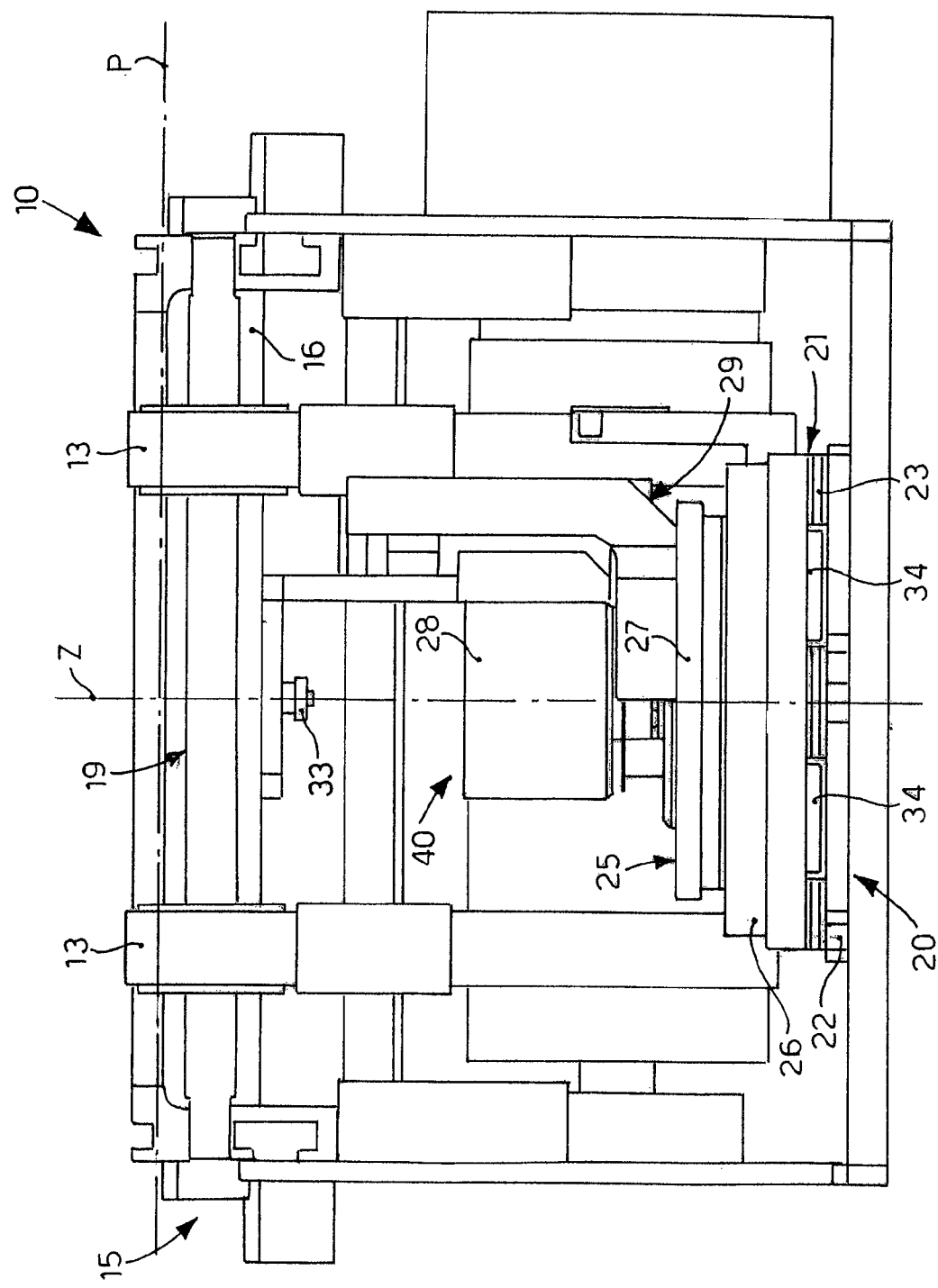
FIG. 3 is a front view of the device in FIG. 1.

With reference to FIG. 1, an alignment device 10 according to the present invention to align plates for electronic circuits, in this specific case a wafer 11, for example silicon based or alumina based, in particular for photovoltaic cells or for green-tape type circuits, comprises a frame 12, substantially parallelepiped in shape, on whose upper surface a conveyor belt of a known type is able to slide. In this case the conveyor belt consists of two parallel belts 13 and is able to slide along a transport axis Y, controlled by a motor member of a known type attached to the frame 12. The conveyor belt is able to transport the wafer 11 from an entrance position 14 to an alignment position 15 defining an alignment plane P (FIG. 3) and subsequently, following possible alignment operations, to a discharge position 19, so as to be sent to following working steps.

The alignment position 15 consists of a box-like element 16 substantially square in shape attached by known attachment means to the upper part of the frame 12 and disposed underneath the parallel belts 13. The box-like element 16 is provided with an aperture 17 substantially square in shape disposed at the center of the box-like element 16 and symmetrical with respect to the transport axis Y.

The alignment device 10 comprises, in correspondence with the alignment position 15 and above it, a TV camera, not shown in the drawings, able to detect the position of the wafer 11 on the alignment position 15. The latter also comprises lighting means 18, in this specific case LED, so as to retro-illuminate the wafer 11, in order to facilitate the acquisition of images by the TV camera.

The alignment device 10 also comprises a mobile alignment turret 20 disposed below the alignment plane P, in correspondence with the aperture 17 and symmetrical with respect to the transport axis Y.

The mobile alignment turret 20 comprises a movement unit 40, comprising a first sliding member 21 and a rotation member 25.

The first sliding member 21 comprises a fixed element 22, substantially square in shape, attached to the base of the frame 12, and provided with guide elements 23, and a mobile element 24, also substantially square in shape, disposed above the fixed element 22 and parallel thereto, able to slide along the guide elements 23 along a first axis X, substantially transverse both with respect to a second axis Z, substantially perpendicular to the alignment plane P, and also, in this case, with respect to the transport axis Y. The mobile element 24 is commanded by movement means such as, for example, sliding blocks with re-circulating balls 34 or linear motors.

Figure 2:
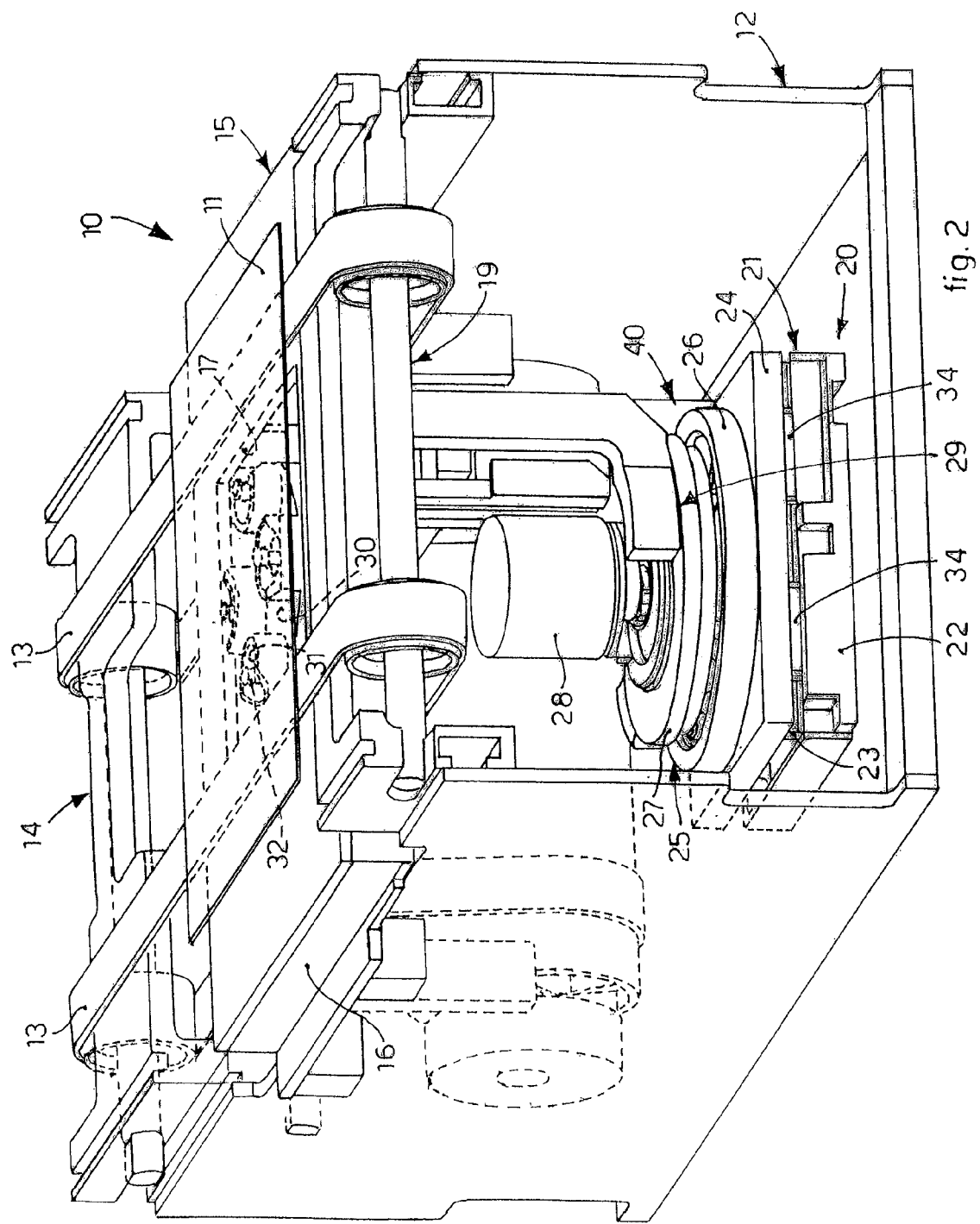
FIG. 2 is another three-dimensional view of the alignment device in FIG. 1, which highlights a detail of the alignment device in FIG. 1.

The rotation member 25 (FIGS. 2 and 3), comprises a fixed part 26, substantially circular in shape, attached to the mobile element 24 of the sliding member 21, and a rotating part 27, also substantially circular in shape, co-axial to the fixed part 26, and having the second axis Z (FIG. 3) as a rotation centre. The rotating part 27 is connected to a motor 28, able to put it into rotation.

The mobile alignment turret 20 also comprises connection means 29, able to connect the rotation member 25, and the sliding member 21, to a manipulator 30, so as to transfer the motion of the rotation member 25 and/or of the sliding member 21 to the manipulator 30.

The manipulator 30, substantially circular in shape, is shaped so as to define on its upper surface seatings 31, substantially semi-circular in shape, inside each of which suction cups 32 are disposed.

The manipulator 30 is disposed substantially in correspondence with the aperture 17 and is symmetrical with respect to the transport axis Y.

The manipulator 30 is provided, at the lower part, with a piston 33, able to move the manipulator 30 along the second axis Z.

The device according to the present invention described heretofore functions as follows.

The conveyor belt carries the wafer 11 present in the entrance position 14, coming from a previous work position, to the alignment position 15. The lighting means 18 is then activated and the TV camera detects the position of the wafer 11 on the alignment position 15.

If the detection made by the TV camera shows the wafer 11 to be aligned, it is transported towards the discharge position 19 in order to be sent to subsequent working steps.

Otherwise, the mobile alignment turret 20 is activated. In this case, the manipulator 30, commanded by the piston 33, is moved in the direction of the wafer 11 located on the alignment position 15, so as to make the suction cups 32 adhere to the lower surface of the wafer 11 and associate the wafer 11 with the mobile alignment turret 20.

Then, on the basis of the information detected by the TV camera and processed by a control unit, the rotation member 25 and/or the sliding member 21 is activated in order to correct the positioning of the wafer 11 so as to achieve the alignment. Once the alignment has been achieved the wafer 11 is transported, by means of the conveyor belt, from the alignment position 15 to the discharge position 19, in order to be sent to subsequent working steps.

It is clear that modifications and/or additions of parts may be made to the alignment device 10 to align plates for electronic circuits as described heretofore, without departing from the field and scope of the present invention.

For example, it also comes within the field and scope of the present invention to provide that the movement unit 40 of the mobile alignment turret 20 comprises a second sliding member, not shown in the drawings, whose mobile element is able to slide along the transport axis Y.

It is also clear that, although the present invention has been described with reference to some specific examples, a person of skill in the art shall certainly be able to achieve many other equivalent forms of alignment device to align plates for electronic circuits, having the characteristics as set forth in the claims and hence all coming within the field of protection defined thereby.

The invention claimed is:

1. An alignment device to align a plate for electronic circuits, comprising:
    transport means for transporting said plate over a mobile alignment turret along a transport axis (Y), at least from an entrance position to an alignment position defining an alignment plane (P), the mobile alignment turret comprising:
        first movement means for vertically moving a portion of said mobile alignment turret in a first direction directed along a first axis (Z) substantially perpendicular to said alignment plane (P) so as to move the portion of said mobile alignment turret with respect to said plate;
        second movement means for rotating said first movement means, with respect to said mobile alignment turret, around said first axis (Z); and
        third movement means for moving said first movement means with respect to said mobile alignment turret, in a second direction, directed along a second axis (X) substantially transverse to said first axis (Z) and substantially perpendicular to and co-planar with said transport axis (Y).

2. The alignment device of the claim 1, wherein said mobile alignment turret is disposed below said alignment plane (P).

3. The alignment device of the claim 1, wherein said mobile alignment turret is provided with fourth movement means for moving said first movement means with respect to said mobile alignment turret, in a third direction, directed along said transport axis (Y).

4. The alignment device of the claim 1, wherein said first movement means comprises manipulator means for adhering to a surface of said plate.

5. The alignment device of the claim 4, wherein said manipulator means comprises gripper elements.

6. The alignment device of claim 5, wherein the gripper elements comprises suction cups.

7. The alignment device of claim 5, wherein the gripper elements are disposed in correspondence with said alignment position and are symmetrical with respect to the transport axis (Y).

8. The alignment device of claim 4, wherein the manipulator means is associated with said plate through an aperture.

9. The alignment device of the claim 1, wherein said mobile alignment turret comprises a movement unit.

10. The alignment device of the claim 9, wherein said movement unit connects said second movement means and said third movement means to said first movement means.

11. The alignment device of the claim 1, further comprising an image acquisition camera disposed in correspondence with said alignment position.

12. The alignment device of the claim 11, further comprising an LED configured to facilitate the acquisition of images detected by the image acquisition camera.

13. A method for aligning a plate for electronic circuits comprising:
   conveying said plate over a mobile alignment turret, along a transport axis (Y), at least from an entrance position to an alignment position defining an alignment plane (P);
   moving vertically a manipulator with respect to the mobile alignment turret in a first direction, directed along a first axis (Z) substantially perpendicular to said alignment plane (P), so as to associate said mobile alignment turret with said plate;
   using a rotation member to rotate said manipulator with respect to said mobile alignment turret, around said first axis (Z);
   using a first sliding member to move said manipulator with respect to said mobile alignment turret, in a second direction, directed along a second axis (X) substantially transverse to said first axis (Z) and substantially perpendicular to and co-planar with said transport axis (Y); and
   using a second sliding member to move said manipulator with respect to said mobile alignment turret, in a third direction, directed along said transport axis (Y).

14. An apparatus for processing a substrate, comprising:
   a conveyor disposed over an alignment plane (P), the conveyor being movable along a transport axis (Y);
   a manipulator disposed below the alignment plane (P), the manipulator being vertically movable in a first direction directed along a first axis (Z) substantially perpendicular to the alignment plane (P);
   a rotation member coupled to the manipulator, the manipulator being rotatable around the first axis (Z);
   a first sliding member coupled to the rotation member, the first sliding member being movable in a second direction directed along a second axis (X), wherein the second axis (X) is substantially perpendicular to and co-planar with the transport axis (Y); and
   a second sliding member coupling to the rotation member, the second sliding member being movable in a third direction directed along the transport axis (Y).

\* \* \* \* \*